US008246926B2

(12) United States Patent
Miyazawa et al.

(10) Patent No.: US 8,246,926 B2
(45) Date of Patent: Aug. 21, 2012

(54) FULLERENE HOLLOW STRUCTURE NEEDLE CRYSTAL AND C60-C70 MIXED FINE WIRE, AND METHOD FOR PREPARATION THEREOF

(75) Inventors: Kun'ichi Miyazawa, Ibaraki (JP); Masahisa Fujino, Ibaraki (JP); Masaru Tachibana, Kanagawa (JP); Ken-ichi Kobayashi, Kanagawa (JP); Tadatomo Suga, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 802 days.

(21) Appl. No.: 10/593,870

(22) PCT Filed: Feb. 14, 2005

(86) PCT No.: PCT/JP2005/002659
§ 371 (c)(1),
(2), (4) Date: Jul. 31, 2007

(87) PCT Pub. No.: WO2005/090232
PCT Pub. Date: Sep. 29, 2005

(65) Prior Publication Data
US 2008/0003165 A1    Jan. 3, 2008

(30) Foreign Application Priority Data

Mar. 23, 2004 (JP) ................. 2004-085588
Jun. 29, 2004 (JP) ................. 2004-192223

(51) Int. Cl.
*C01B 31/02*    (2006.01)
(52) U.S. Cl. ............. 423/445 B; 977/734; 977/740
(58) Field of Classification Search ............ 423/445 B, 423/447.2; 977/734, 740
See application file for complete search history.

(56) References Cited

U.S. PATENT DOCUMENTS 7,291,318 B2 *  11/2007  Sakurabayashi et al. .. 423/447.1
(Continued)

FOREIGN PATENT DOCUMENTS

JP    2003-1600    1/2003

OTHER PUBLICATIONS

Fagan, et al., Metal Complexes of Buckminsterfullerene (C60), Acc. Chem. Res. 1992; 25: 134-142.*

(Continued)

*Primary Examiner* — Daniel C. McCracken
(74) *Attorney, Agent, or Firm* — Wenderoth, Lind & Ponack, L.L.P.

(57) ABSTRACT

A needle crystal in the form of a capsule comprising fullerene molecules such as $C_{60}$ and a $C_{60}$ platinum derivative and having a hollow portion (a fullerene shell capsule) is provided. The fullerene shell capsule which has been prepared by the liquid-liquid interface precipitation method, which comprises (1) a step in which a solution containing a first solvent dissolving fullerene therein is combined with a second solvent in which the solubility of fullerene is lower than in the above first solvent; (2) a step in which a liquid-liquid interface is formed between the above solution and the above second solvent; and (3) a step in which a carbon fine wire is precipitated on the above liquid-liquid interface, has a novel characteristic in its form and can be used as a catalyst supporting material, a raw material for a plastic composite material, a storage material for gas such as hydrogen, a catalyst for fuel cell, or the like. Further, provided are novel $C_{60}$-$C_{70}$ mixed fine wire which is fullerene fine wire comprising two components of $C_{60}$ and $C_{70}$, and a method for preparing the mixed fine wire.

11 Claims, 20 Drawing Sheets

U.S. PATENT DOCUMENTS

2002/0192143 A1* 12/2002 Miyazawa et al. ......... 423/447.2

OTHER PUBLICATIONS

Miyazawa, et al., Transmission electron microscopy investigation of tubular and capsular needlelike crystals of C60 produced by the liquid-liquid interfacial precipitation method, J. Mater. Res. 2004; 19(11): 3145-3148.*

Miyazawa, et al., Transmission electron microscopy investigation of fullerene nanowhiskers and needle-like precipitates formed by using C60 and (η2-C60)Pt(PPh3)2, J. Mater. Res. 2004; 19(8): 2410-2414.*

* cited by examiner (a)

(b)

0.000      8- 5                              VFS – 16         20. 480
286      EXEC (7-D)         DATA LABEL

FULLERENE HOLLOW STRUCTURE NEEDLE CRYSTAL AND C60-C70 MIXED FINE WIRE, AND METHOD FOR PREPARATION THEREOF

TECHNICAL FIELD

The present invention relates to fullerene-type carbon materials, particularly a needle crystal (fullerene shell capsule) $C_{60}$-$C_{70}$ mixed fine wire comprising fullerene molecules and having hollow structure and a method for preparation thereof.

BACKGROUND ART

Recently, fullerene fine wire (fullerene nanowhisker, fullerene nanofiber) has been widely noticed by domestic and foreign research institutes, non-governmental enterprises, and universities, among which a keen competitive race for development has become serious. Previously, the present inventors developed a method for preparing fullerene fine wire by means of a liquid-liquid interface precipitation method (Patent documents 1 and 2; non-patent document 1).

In order to obtain carbon fine wire comprising fullerene as a component, the method for preparing carbon fine wire comprises (1) a step in which a solution containing a first solvent dissolving fullerene therein is combined with a second solvent in which the solubility of fullerene is lower than in the above first solvent; (2) a step in which a liquid-liquid interface is formed between the above solution and the above second solvent; and (3) a step in which carbon fine wire is precipitated on the above liquid-liquid interface. The present inventors further have elucidated that irradiation of a visible light during the growth of fullerene fine wire greatly promotes the growth of the fine wire (non-patent document 2).

The previously prepared fine wire, however, was a monomer comprising a $C_{60}$ molecule or $C_{70}$ molecule only, of which the physicochemical properties were inherent in $C_{60}$ or $C_{70}$, respectively. Therefore, if the physicochemical properties such as electrical property, mechanical property, thermal property, optical property, and so on can be changed, it would be effective for practical use of fullerene wire.

Further, Miyazawa, one of the present inventors, has discovered that thermal treatment of $C_{60}$ nanowhisker affords a fullerene shell tube having amorphous carbon wall (non-patent document 3; patent document 3).

Patent document 1: JP-A-2003-1600
Patent document 2: USP-A-20020192143
Non-patent document 1: K. Miyazawa, Y. Kuwasaki, A. Obayashi and M. Kuwabara, "C60 nanowhiskers fromed by the liquid-liquid interfacial precipitation method", J. Mater, Res., 17(1)(2002) 83-88
Patent document 3: JP Appln. No. 2003-346117
Non-patent document 2: M. Tachibana, K. Kobayashi, T. Uchida, K. Kojima, M. Tanimura and K. Miyazawa, "Photo-assisted growth and polymerization of C60 nanaowhiskers", Chemical Physics Letter 374 (2003) 279-285
Non-patent document 3: Kun'chi Miyazawa, Kogyo Zairyo, 52 (1)(2004) 24-25

DISCLOSURE OF INVENTION

In the above-mentioned background, the purpose of the invention is to provide fullerenes having a feature in the new shape.

First, the invention provides a capsule-like needle crystal (fullerene shell capsule) comprising fullerenes molecule such as $C_{60}$ or $C_{70}$ platinum derivative and having hollow structure. The present inventors previously developed a method for preparing fullerene fine wire by means of a liquid-liquid interfacial precipitation method; in this invention, this method is applied to allow the preparation of a capsule-like needle crystal (fullerene shell capsule) comprising $C_{60}$ fullerene molecules and $C_{60}$ platinum derivative.

The fullerene shell capsule is characterized by needle crystal comprising fullerene molecules such as $C_{60}$ and having hollow structure. This fullerene shell capsule is a material that was first synthesized and discovered by means of the liquid-liquid interfacial precipitation method established by the present inventors as a method of synthesizing fullerene nanowhiskers at usual temperature. The hollow needle crystals comprising fullerene molecules have not yet been reported. The fullerene shell capsule is a new type of fullerenes, since there is no similar case. The fullerene shell capsule has utility as catalyst carrier material, raw material for plastic composite materials, storage material for gas such as hydrogen, catalyst for fuel cell, and the like.

That is, the invention firstly provides a needle crystal comprising a $C_{60}$ platinum derivative.

In addition, the invention secondly provides a crystal comprising a $C_{60}$ platinum derivative and a $C_{60}$ fullerene molecule.

In addition, the invention thirdly provides a needle crystal which is characterized by having a hollow structural portion.

The invention fourthly provides the needle crystal as described above, being denatured by heating or electron beam.

The invention fifthly provides the needle crystal as described above, being in a closed form or holed form.

The invention sixthly provides the needle crystal as described above, wherein the $C_{60}$ platinum derivative is $(\eta^2\text{-}C_{60})Pt(PPh_3)_2$.

The invention seventhly provides a method for preparing a needle crystal comprising a $C_{60}$ platinum derivative, which comprises (1) a step in which a solution containing a first solvent dissolving the $C_{60}$—platinum derivative therein is combined with an alcohol as a second solvent; (2) a step in which a liquid-liquid interface is formed between the above solution and the above second solvent; and (3) a step in which a carbon fine wire is precipitated on the above liquid-liquid interface.

In addition, the invention eighthly provides a method for preparing a needle crystal comprising a $C_{60}$ platinum derivative and $C_{60}$ fullerene molecules by a liquid-liquid interfacial precipitation method, which comprises (1) a step in which a solution containing a first solvent dissolving the $C_{60}$ platinum derivative and the $C_{60}$ fullerene molecules therein is combined with an alcohol as a second solvent; (2) a step in which a liquid-liquid interface is formed between the above solution and the above second solvent; and (3) a step in which a carbon fine wire is precipitated on the above liquid-liquid interface.

Ninthly, the invention provides the method for preparing a needle crystal as described above, wherein the $C_{60}$ platinum derivative is $(\eta^2\text{-}C_{60})Pt(PPh_3)_2$.

Further, the invention tenthly provides the method for preparing a needle crystal as described above, wherein the first solvent is toluene.

The invention eleventhly provides the method for preparing a needle crystal as described above, wherein the second solvent is isopropyl alcohol.

According to the method for preparation of a $C_{60}$-$C_{70}$ mixed fine wire in the invention, it is possible to readily prepare the $C_{60}$-$C_{70}$ mixed fine wire in which a $C_{60}$ molecule is mixed with a $C_{70}$ molecule.

BEST MODE FOR CARRYING OUT THE INVENTION

Figure 1:
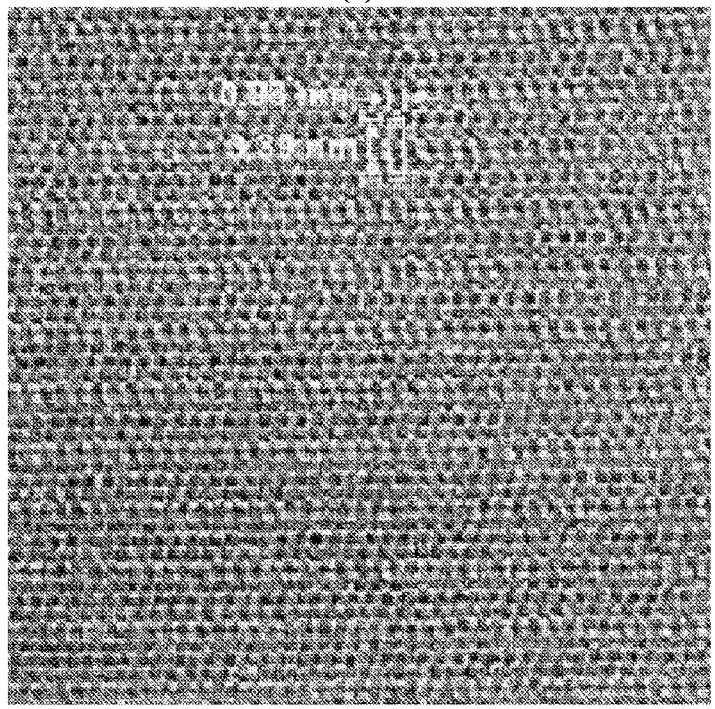
FIG. 1 shows a TEM image (a) and an HRTEM image (b) of $(\eta^2\text{-}C_{60})Pt(PPh_3)_2$ needle crystal prepared from a saturated toluene solution of $(\eta^2\text{-}C_{60})Pt(PPh_3)_2$ and an isopropyl alcohol medium by a liquid-liquid interfacial precipitation method. The unit cell is indicated by a rectangle.
Figure 1:
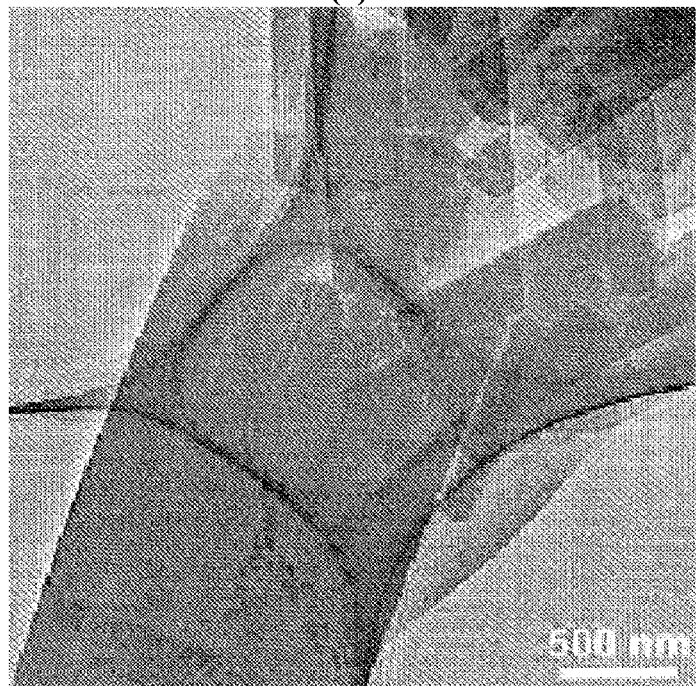

<A> Fullerene Hollow Structural Needle Crystal and a Method for Preparation Thereof The above liquid-liquid interfacial precipitation method developed by the present inventors is as follows.

The preparation of the carbon fine wire containing fullerene as a component comprises (1) a step in which a solution containing a first solvent dissolving fullerene therein is combined with a second solvent in which the solubility of fullerene is lower than in the above first solvent; (2) a step in which a liquid-liquid interface is formed between the above solution and the above second solvent; and (3) a step in which carbon fine wire is precipitated on the above liquid-liquid interface.

The preparation of fullerene shell capsule can be attained by controlling the rate of growth of crystal in the above liquid-liquid interface precipitation method, and the process can be carried out in a convenient way in a condition of usual temperature and atmospheric pressure using only an organic solution (2nd solution) to which has been added a platinum derivative. This process may be conducted under a usual white luminescent light or under 1 a light of selected wavelength.

According to the invention, the fullerene shell capsule can be produced in a closed shape or in a holed shape. For example, a liquid-liquid interface is formed between isopropyl alcohol and a saturated $C_{60}$ toluene solution, to which has been added several percent by weight of $C_{60}$ Pt derivative $((\eta^2\text{-}C_{60})Pt(PPh_3)_2)$, in a glass bottle, which is allowed to stand at 10° C.-25° C. (desirously 20° C.) for a day to 1 month or longer; thus, the precipitation method affords a hollow-structural needle crystal. The amount of $(\eta^2\text{-}C_{60})Pt(PPh_3)_2$ to be added is desirably 1-10 mass % for $C_{60}$.

The size of the resulting needle crystal is in the range of 10 nm to 100 micrometer in diameter and 10 nm to several micrometer in length.

The aspect ratio which is defined as the ratio of diameter to length, is 1 or more. Irradiation of electron beam to the resulting needle crystal makes platinum fine particle deposit in nanometer size, which can be dispersed. The needle crystal can be converted into amorphous structure by a secondary action such as vacuum thermal treatment at 600° C. or higher or irradiation of electron beam with high energy of 100 keV or higher.

Further, the invention provides a guideline for obtaining a hollow fiber (true fullerene shell tube) comprising fullerene molecules. In addition, this method can be generally applied to higher order fullerenes of $C_{70}$ or higher, metal-intercalating fullerenes and fullerene derivatives such as $C_{60}[C(COOC_2H_5)_2]$ in addition to the above-mentioned fullerenes.

EXAMPLE 1

Method of Preparation

A saturated toluene solution of $C_{60}$ platinum derivative $(\eta^2\text{-}C_{60})Pt(PPh_3)_2$ was provided. $(\eta^2\text{-}C_{60})Pt(PPh_3)_2$ was purchased from Science Laboratories Co., Ltd. A special grade of toluene was used. The above saturated solution of toluene was put in a proper-sized clear glass bottle (preferred to use a bottle of 5 mL-20 mL volume) up to the half level, and the bottle was placed on a cooling plate and cooled to about 20° C. or lower. Isopropyl alcohol (IPA; preferably special grade purity) cooled to about 20° C. or lower was dropwise added slowly or poured along the wall of bottle with a pipette into the above glass bottle to form a liquid-liquid interface between the fullerene-toluene solution and IPA. A series of operations up to this step were carried out under a usual white fluorescent light. The glass bottle in which a liquid-liquid interface was formed was allowed to stand at 20° C. for a period of 13 to 55 days to grow needle crystals.

Observation Under a Transmission Electron Microscope

FIG. 1 shows a TEM image of $(\eta^2\text{-}C_{60})Pt(PPh_3)_2$ needle crystal prepared by the liquid-liquid interfacial precipitation method using a saturated toluene solution of $C_{60}$ platinum derivative $(\eta^2\text{-}C_{60})Pt(PPh_3)_2$ and isopropyl alcohol medium, and its HRTEM image and FFT (fast Fourier transform) figure. As clearly seen from the HRTEM image, the space between $C_{60}$ cages in the $(\eta^2\text{-}C_{60})Pt(PPh_3)_2$ molecule is 0.98 nm, which is identical to the distance between the centers of $C_{60}$ molecules in $C_{60}$ nanowhisker. This indicates that the $C_{60}$ molecule has to be arranged densely in the direction of the growth axis in order that the $(\eta^2\text{-}C_{60})Pt(PPh_3)_2$ needle crystal is capable of growing. This is an important guiding principle to form a long fiber of $(\eta^2$-$C_{60})Pt(PPh_3)_2$.

EXAMPLE 2

Method of Preparation

A $C_{60}$-saturated toluene solution to which was added $(\eta^2$-$C_{60})Pt(PPh_3)_2$ was provided. $(\eta^2$-$C_{60})Pt(PPh_3)_2$ was purchased from Science Laboratories Co., Ltd. The purity of $C_{60}$ was 99.5% (MTR Co.), and a special grade of toluene was used. The amount of $(\eta^2$-$C_{60})Pt(PPh_3)_2$ to be added was 6 mass % for $C_{60}$. Otherwise, the growth of needle crystal was conducted in the same manner as in Example 1.

Observation Under a Transmission Electron Microscope

Figure 2:
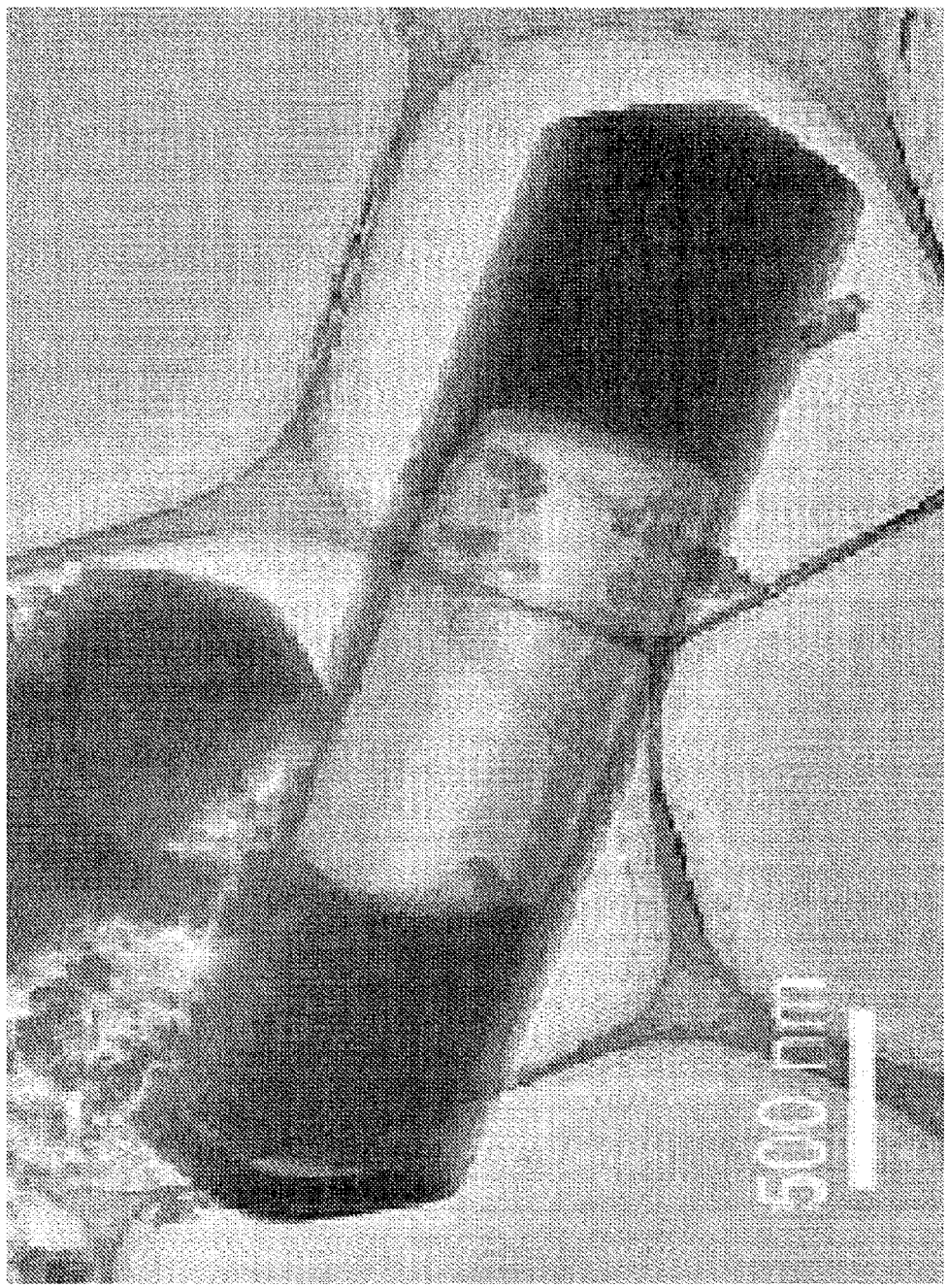
FIG. 2 shows a TEM image (400 kV) of fullerene shell capsule.
Figure 3:
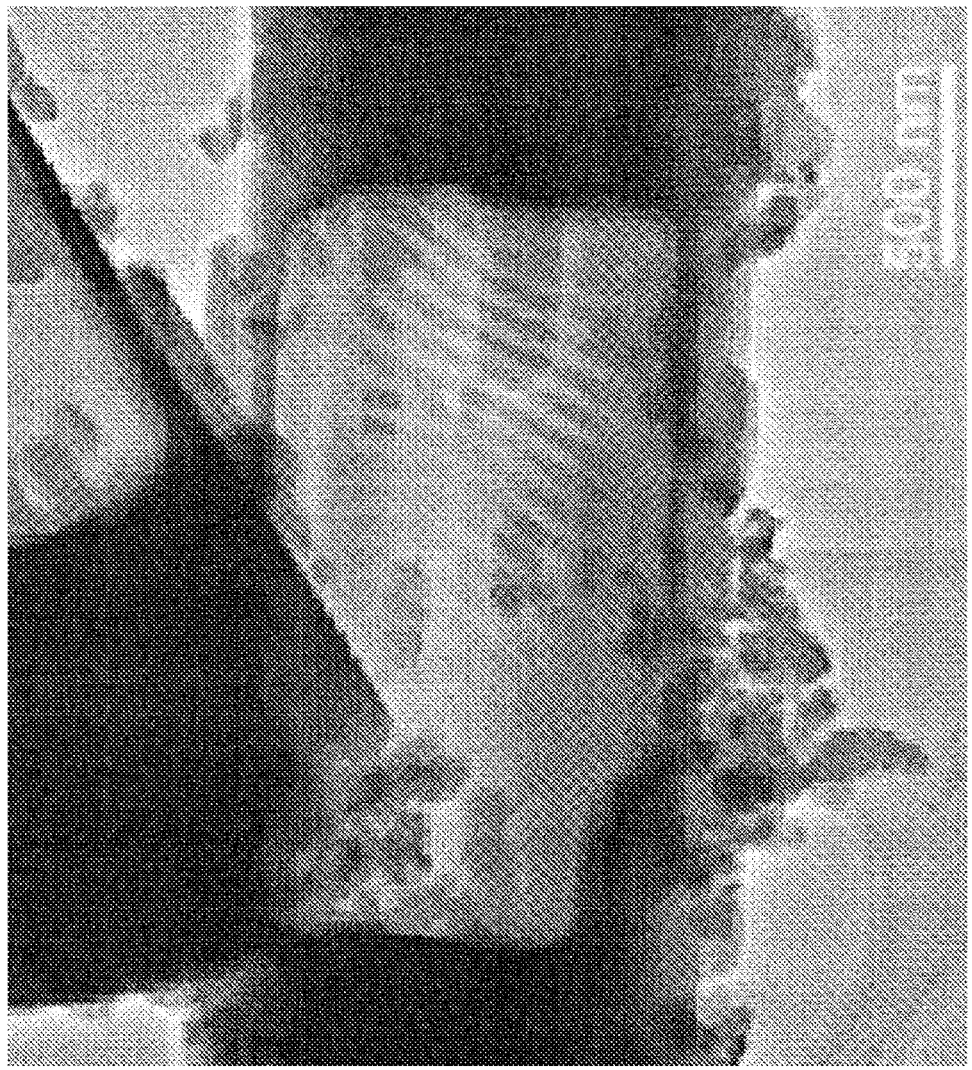
FIG. 3 shows a TEM image of $C_\alpha$ fullerene shell capsule.

FIG. 2 shows an example of a transmission electron microscopic (TEM) image of $C_{60}$ hollow needle crystal (fullerene shell capsule) generated in a $C_{60}$-6% $(\eta^2$-$C_{60})Pt(PPh_3)_2$ saturated toluene solution-IPA medium (JEM-4010, observed at 400 kV). FIG. 3 shows an enlarged figure of the capsule portion of fullerene shell capsule. The existence of the hollow portion is apparent from the observation of a moire fringe.

Figure 4:
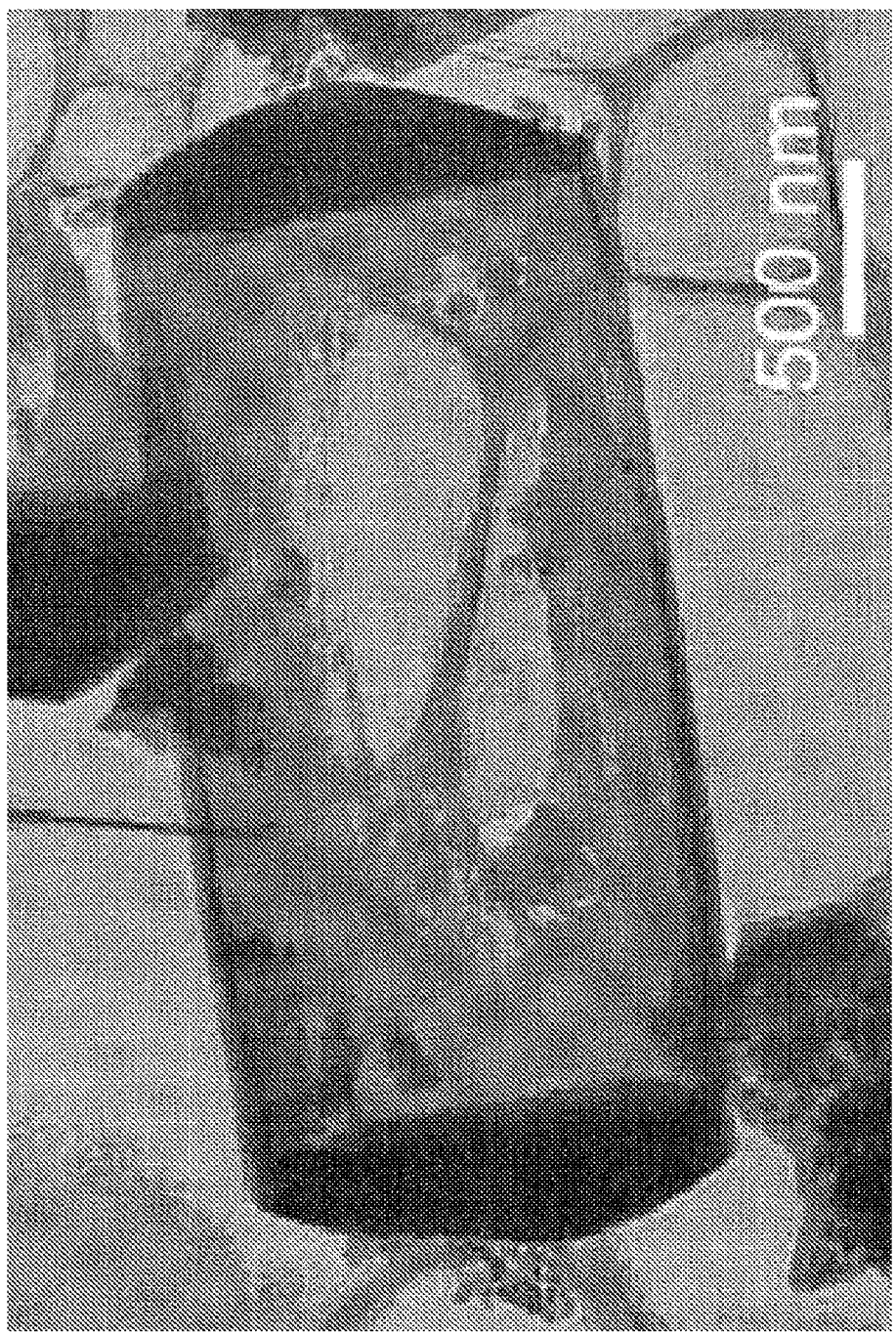
FIG. 4 shows a holed TEM image of fullerene shell capsule.
Figure 5:
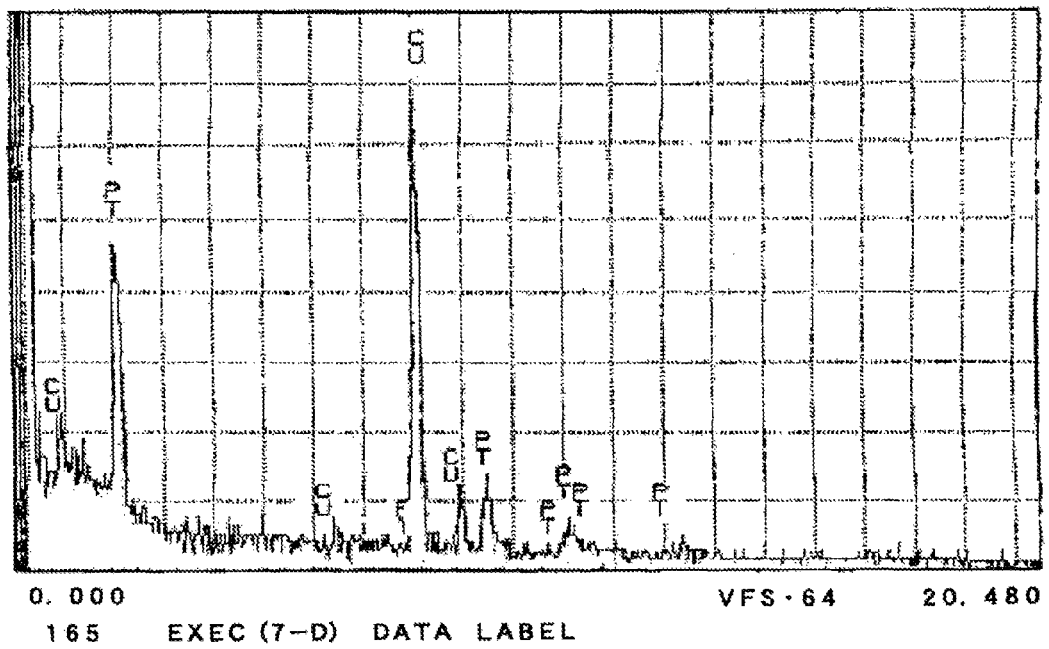
FIG. 5 shows an EDX analysis of $C_{60}$ fullerene shell capsule (FIG. 3) by a transmission electron microscope.

In addition to the closed fullerene shell capsule, a holed fullerene shell capsule can also be prepared, as shown in the TEM photograph of FIG. 4. The holed fullerene shell capsule allows easy operation for the support of a functional group or catalyst. FIG. 5 shows the result of EDX analysis of the fullerene shell capsule shown in FIG. 3. It is found that the $C_{60}$ platinum derivative $(\eta^2$-$C_{60})Pt(PPh_3)_2$ has been incorporated since platinum is detected. The peak of copper (Cu) is attributed to the TEM micro-grid backing.

Figure 6:
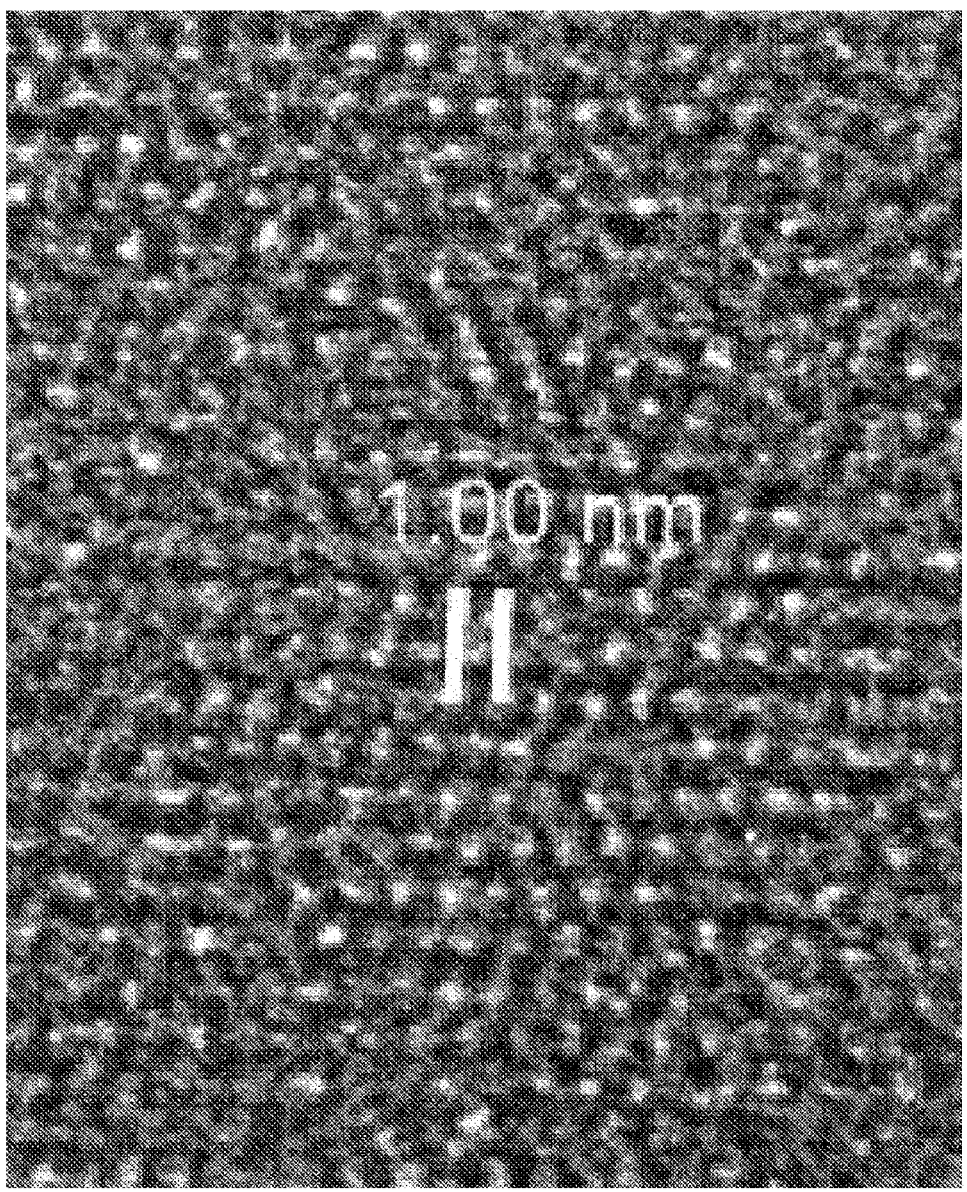
FIG. 6 shows an HRTEM image for a fullerene shell capsule in FIG. 3.
Figure 7:
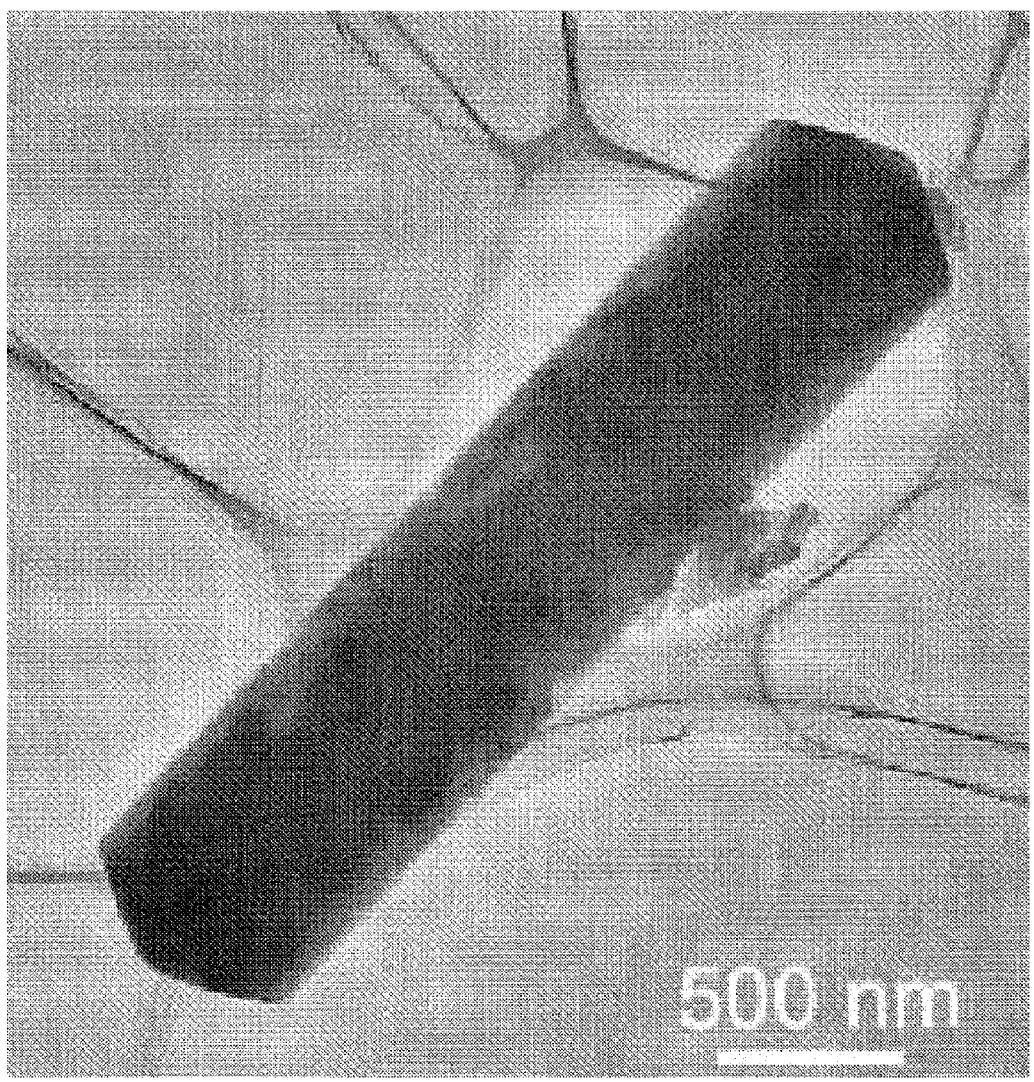
FIG. 7 shows a TEM image of $C_{60}$ needle crystal to which has been added $(\eta^2\text{-}C_{60})Pt(PPh_3)_2$.
Figure 8:
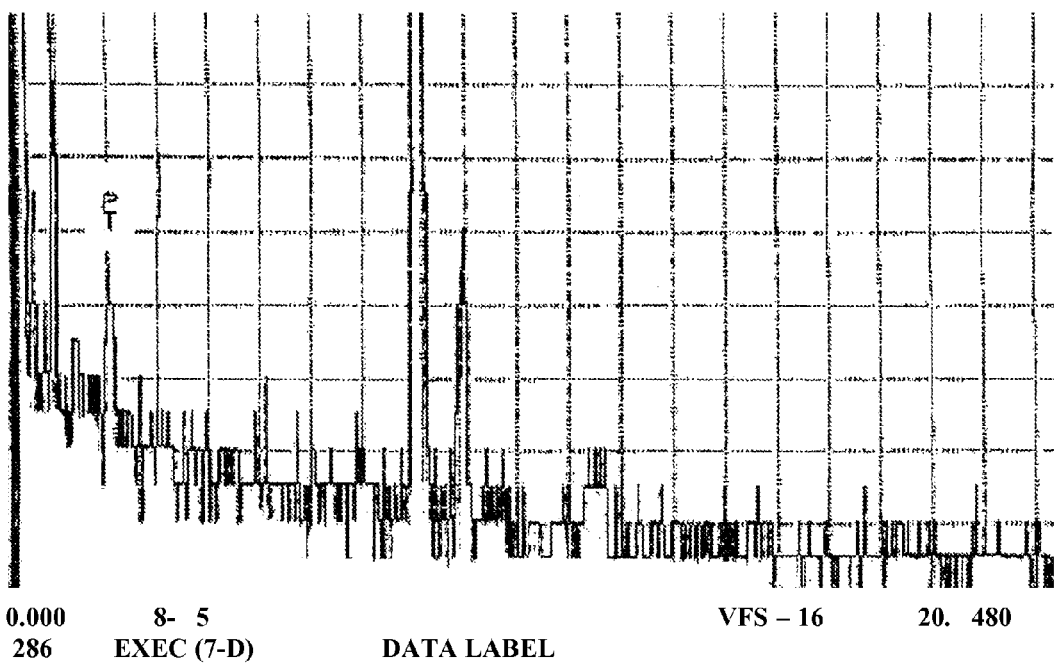
FIG. 8 shows a TEM-EDX analysis of $C_{60}$ needle crystal (FIG. 7) containing $C_{60}$ Pt derivative $((\eta^2\text{-}C_{60})Pt(PPh_3)_2)$.

FIG. 6 shows a high resolution TEM image (HRTEM) at the center in FIG. 3. This figure shows a state of $C_{60}$ cages which are arranged at spaces of 1.0 nm. From FIGS. 5 and 6, it is apparent that the materials shown in FIGS. 2 and 3 are $C_{60}$ hollow needle crystals containing $(\eta^2$-$C_{60})Pt(PPh_3)_2$. FIG. 7 shows a TEM image of $(\eta^2$-$C_{60})Pt(PPh_3)_2$-added $C_{60}$ needle crystal with no cavity. From the TEM-EDX analysis of FIG. 8, it is confirmed that the $C_{60}$ needle crystal of FIG. 7 contains the platinum derivative.

EXAMPLE 3

Figure 9:
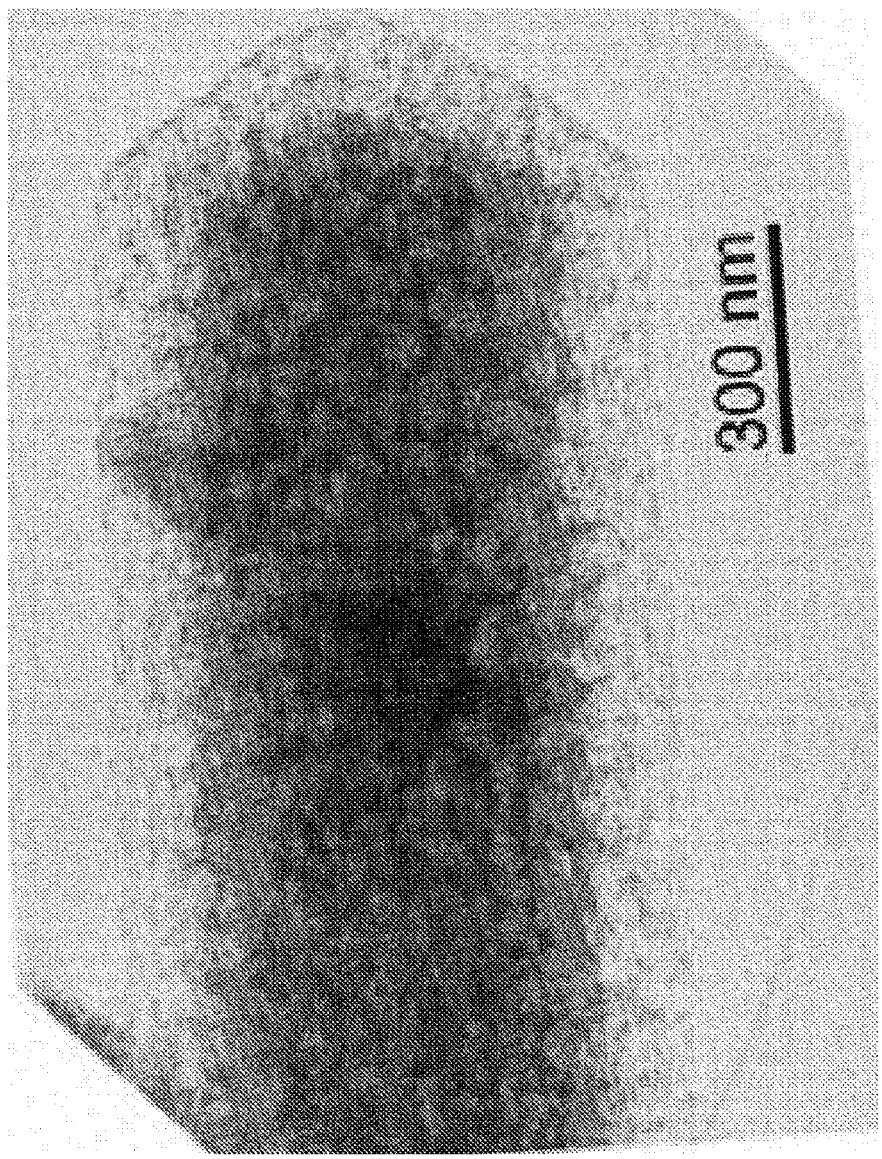
FIG. 9 shows a TEM image of $C_{60}$ needle crystal containing $(\eta^2\text{-}C_{60})Pt(PPh_3)_2$ which is amorphous by irradiation of electron beam.
Figure 10:
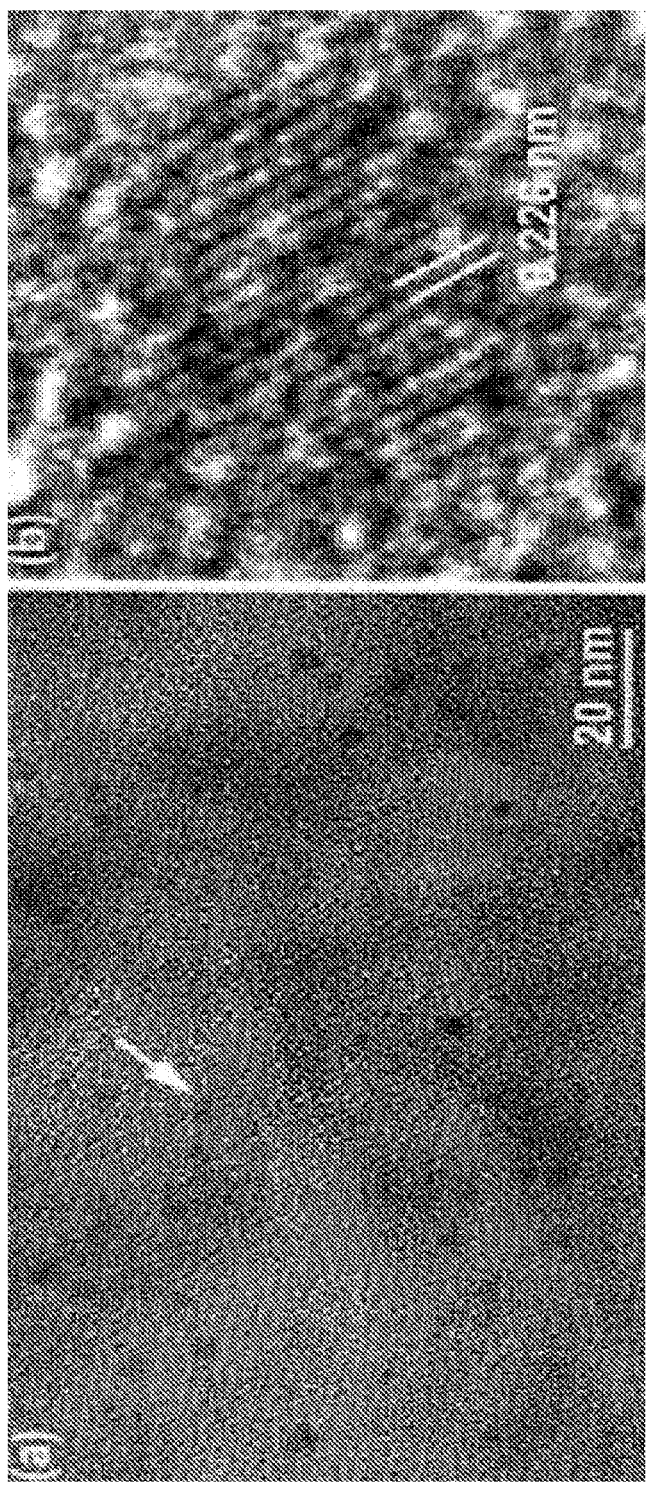
FIG. 10 shows (a) platinum nano particles (particle size=3.2±0.8 nm) generated by irradiating a $(\eta^2\text{-}C_{60})Pt(PPh_3)_2$-added $C_{60}$ needle crystal with electron beam; and (b) an HRTEM image of the platinum nano particle.

The needle crystal obtained in Example 1 was irradiated with an electron beam at 400 keV energy and a beam density of about 200 pAcm$^{-2}$. FIG. 9 shows a TEM image of $(\eta^2$-$C_{60})Pt(PPh_3)_2$-added $C_{60}$ needle crystal in an amorphous state. FIG. 10 shows an HRTEM image of platinum nano particle generated in the needle crystal of FIG. 9, and a lattice image of the platinum particle (111) surface. Such a $C_{60}$ needle crystal in which the platinum nano particles are dispersed is expected to be useful as a catalyst for fuel cell.

EXAMPLE 4

Method for Preparation of a $C_{60}$ Nanotube (Hollow Fiber) and $C_{60}$ Needle Crystal Having a Hollow Portion Fullerene powder of a $C_{60}$-1 mol % $(\eta^2$-$C_{60})Pt(PPh_3)_2$ composition ($C_{60}$-2 mass % $(\eta^2$-$C_{60})Pt(PPh_3)_2$ composition) (MRT Co.) was dissolved in 5 mL of toluene by ultra-sonication to give a saturated solution. This fullerene-saturated toluene solution (10 mL) was placed in a clear glass bottle, to which was added an approximately the same volume of isopropyl alcohol (IPA) slowly with a pipette to form a liquid-liquid interface between the lower toluene solution and the upper IPA. The liquid was kept at 20° C. or lower. The glass bottle was stored in a low temperature incubator at 20° C. for 10 days.

Observation Under a Transmission Electron Microscope

Figure 11:
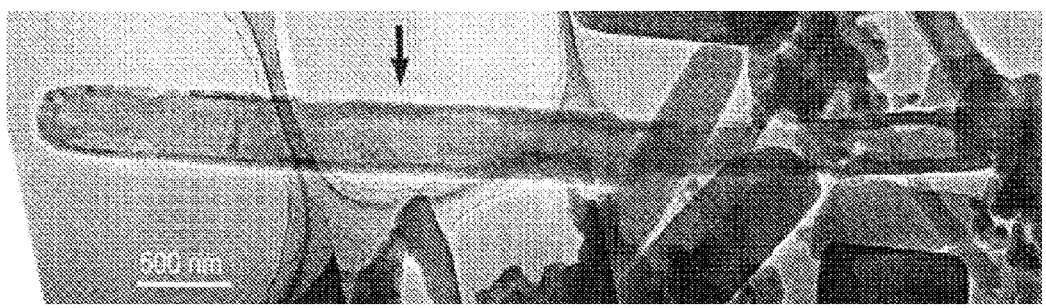
FIG. 11 shows a TEM image of $C_{60}$ nanotube.

The deposit yielded in the glass bottle was placed on a carbon micro-grid and observed with a transmission electron microscope (JEM-4010, accelerating voltage 400 kV). FIG. 11 shows a $C_{60}$ nanotube ($C_{60}$NT) of 340 nm in diameter, 46±9 nm in wall thickness, and 5 μm or more of length. There are many nano-sized openings on the $C_{60}$NT wall; therefore, a variety of molecules can be incorporated in the tube; this indicates that the nanotube has a high specific surface area.

Figure 12:
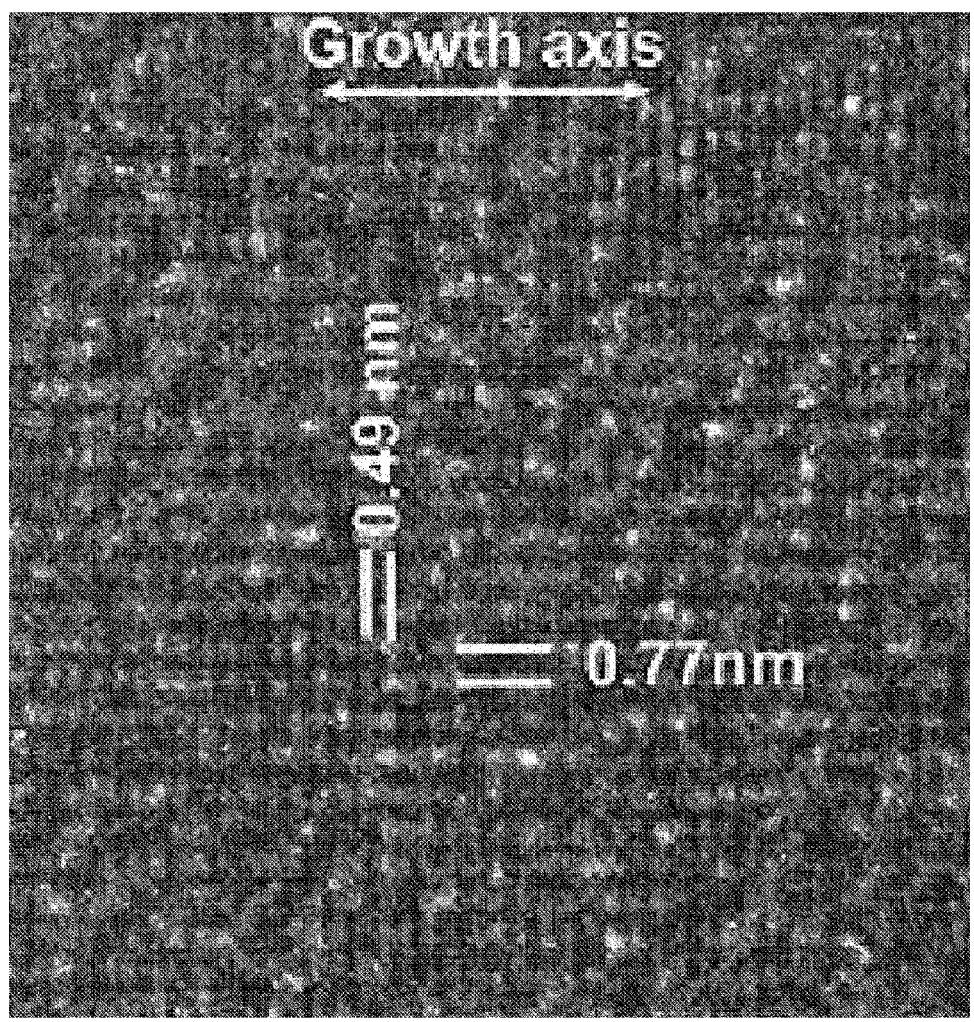
FIG. 12 shows an HRTEM image of $C_{60}$ nanotube of FIG. 11.

FIG. 12 shows a high resolution TEM image (HRTEM) of FIG. 11. As shown in FIG. 12, this $C_{60}$NT can be represented by an exponent as a face-centered cubic crystal (fcc) of the lattice constant a=1.36±0.02 nm. It was found that the central space between the $C_{60}$ molecules becomes narrow by about 4% in comparison with $C_{60}$ molecule crystal (fcc, lattice constant a=1.417 nm) at usual temperature and atmospheric pressure.

Figure 13:
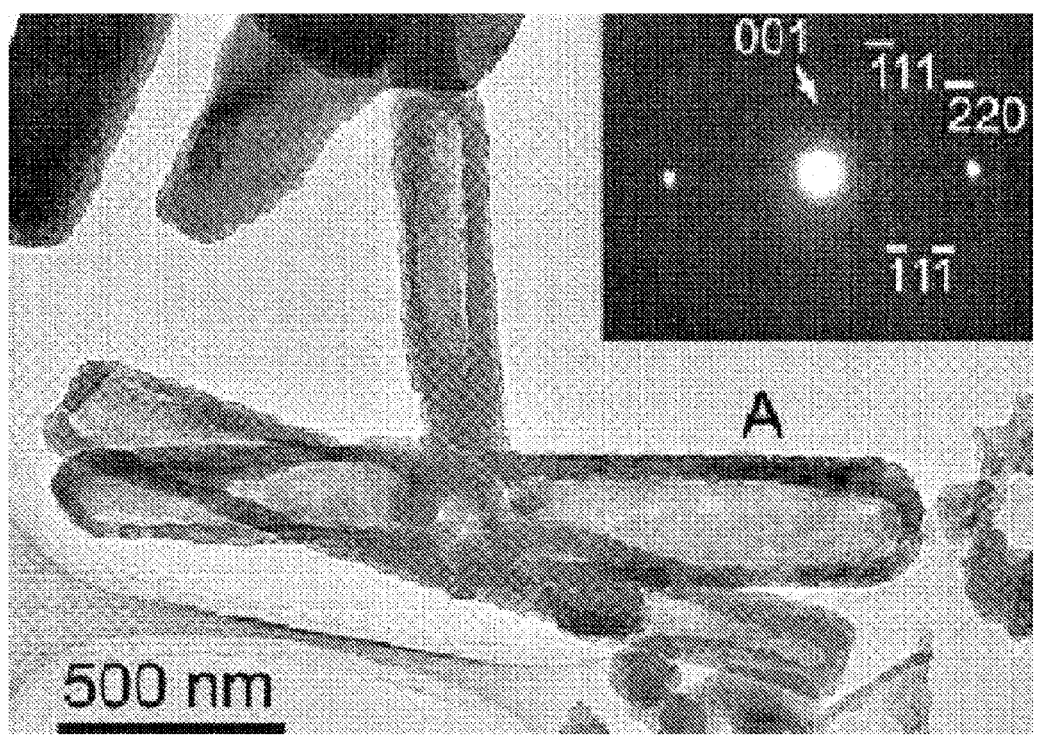
FIG. 13 shows a TEM image of $C_{60}$ nanotube closing at the both ends.

FIG. 13 shows a TEM image of $C_{60}$NT having a smaller aspect ratio. This is found to be crystalline, as shown in the electron diffraction pattern of $C_{60}$NT indicated by A in FIG. 13. Further, it is also found that there are many nano-sized openings on the $C_{60}$NT surface.

Figure 14:
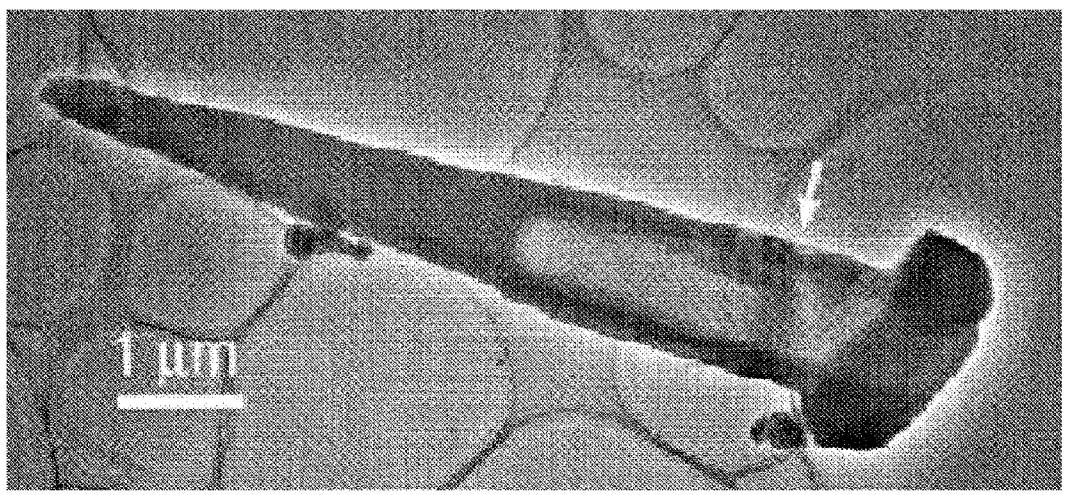
FIG. 14 shows a TEM image of a hollow wedge-form $C_{60}$ needle crystal having closed shell structure.

As shown in FIG. 14, a $C_{60}$ tubular structure having a wedge-form end (a hollow wedge-form $C_{60}$ needle crystal) was also prepared. As shown by an arrow mark in FIG. 14, moire stripes are observed, which indicate the surface layer being single crystal. It was also found that the surface of the hollow wedge-form $C_{60}$ needle crystal has completely closed structure.

Figure 15:
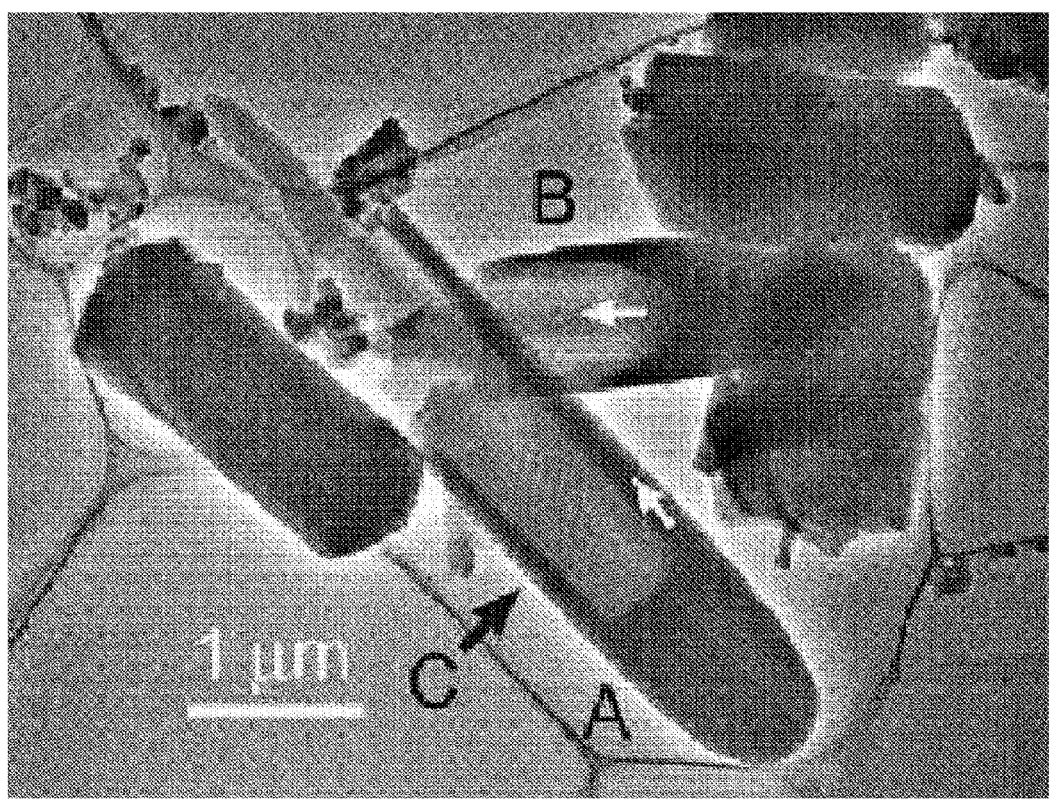
FIG. 15 shows a TEM image of $C_{60}$ nanotube (A, B) closing only at one end.

FIG. 15 shows a $C_{60}$ needle crystal of which only one end has closed structure. As shown by an arrow mark C in the needle crystal A, it is found that it is a single crystal of which the surface shell structure is $C_{60}$ since moire stripes are observed. B is a $C_{60}$ needle crystal having a small aspect ratio of about 2; from its form, a growth mechanism is proposed that the growth of the hollow-structural $C_{60}$ crystal proceeds through first formation of shell structure and subsequent filling of the inside.

Figure 16:
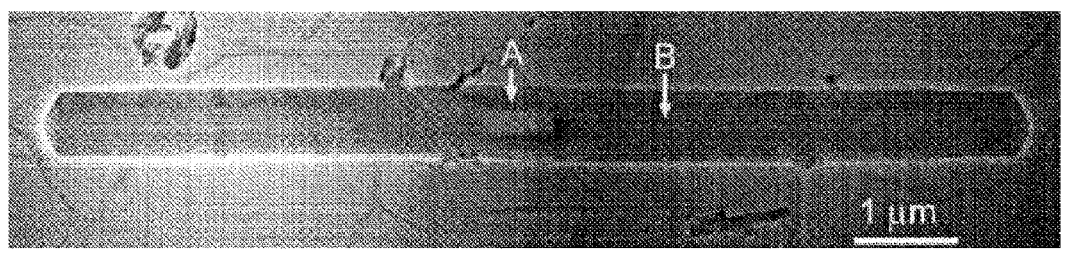
FIG. 16 shows a TEM image of $C_{60}$ needle crystal having a hollow portion A.

FIG. 16 supports the above-mentioned growth mechanism. FIG. 16 is an example of the preparation of a $C_{60}$ needle crystal having a hollow portion A. The hollow portion A in the $C_{60}$ needle crystal is considered to be formed because the needle crystalline shell structure with closed structure grows at the terminal portion and cannot fill up completely the inside of crystal. The linear contrast B indicating that the clearer low-dense structure is formed along the growth axis suggests that the cavity has been formed during growth.

<B> $C_{60}$-$C_{70}$ Mixed Wire and a Method for Preparation Thereof

In preparing the $C_{60}$-$C_{70}$ mixed wire, a mixed powder of $C_{60}$ and $C_{70}$ is dissolved in a relatively low polar organic solvent, to which is added a polar solvent to yield $C_{60}$-$C_{70}$ fine wire by a liquid-liquid interfacial precipitation method. In this operation, alcohol, DMY, DMSO, nitrile, halogenated hydrocarbon, and the like are selected as polar solvents, and among them, alcohol, particularly, isopropyl alcohol is preferred. It may be used in a proper amount allowing the formation of a liquid-liquid interface to deposit fullerene ($C_{60}$-$C_{70}$) mixed wire.

EXAMPLE 5

$C_{60}$ (99.9% purity) powder and $C_{70}$ (99.9% purity) powder were mixed as a variety of compositions (mass % of $C_{70}$: 0%, 6.5%, 10.3%, 18.0%, 21.3%, 25.3%, 33.6%, and 100%), and the mixtures of powder respectively were dissolved in 25 ml of m-xylene to give saturated solutions. The solutions of $C_{60}$ and $C_{70}$ mixtures, each was poured into a clear glass vial, to which was added slowly isopropyl alcohol along the wall of tube to form a liquid-liquid interface, and the solution was allowed to stand in an atmosphere of 20° C. for 2 weeks. Thereafter, the solution was filtered to collect the resulting fine wire. And, the fine wire was dissolved in toluene and applied to high performance liquid chromatography (HPLC) to determine the compositional ratio of $C_{60}$ and $C_{70}$. The structure was analyzed by X-ray diffraction method and Raman spectrometry.

Figure 17:
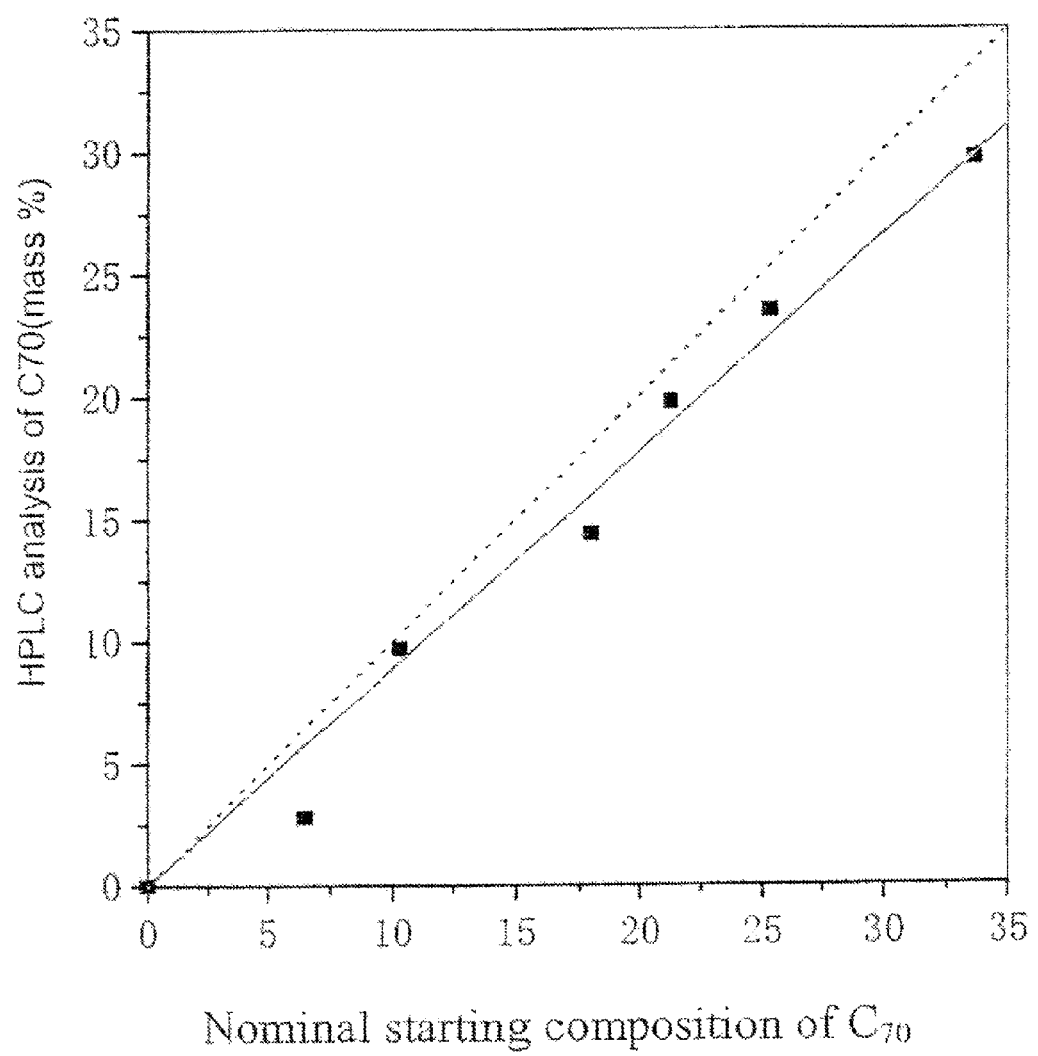
FIG. 17 shows a graph showing a relationship between the blended composition of a saturated m-xylene solution and the analytical result of high performance liquid chromatography of $C_{60}$-$C_{70}$ mixed fine wire obtained from each solution.

FIG. 17 shows a relationship between the composition of the saturated m-xylene solution applied and the analytical results by high performance liquid chromatography of the $C_{60}$-$C_{70}$ mixed wire obtained from each solution. There is a compositional gap between the solution and the amount applied, indicating that the $C_{70}$ incorporated in the fine wire is slightly reduced in comparison with the composition applied. This means that $C_{70}$ hardly becomes fine wire compared to $C_{60}$.

Figure 18:
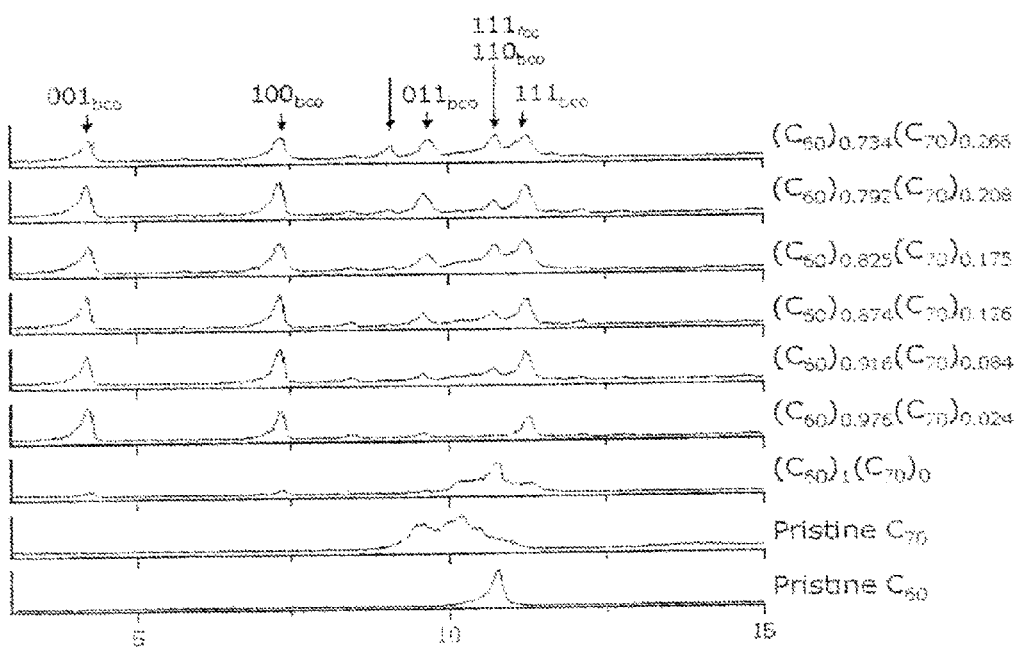
FIG. 18 shows an X-ray diffraction pattern of $C_{60}$-$C_{70}$ mixed fine wire in each composition (indicated by molar %).

FIG. 18 shows an X-ray diffraction pattern of the $C_{60}$-$C_{70}$ mixed wire of the respective compositions (indicated by mole %). It can been seen that the addition of $C_{70}$ affords a body-centered orthorhombic crystal. In addition, it can also be seen that increase of the amount of $C_{70}$ to be added improves crystalinity in comparison with $C_{60}$. On the other hand, the peak inherent in the crystal of $C_{70}$ molecule with the increase of the amount of $C_{70}$ to be added cannot be observed. From this fact, $C_{70}$ seems to be solid soluble in the $C_{60}$ matrix.

Figure 19:
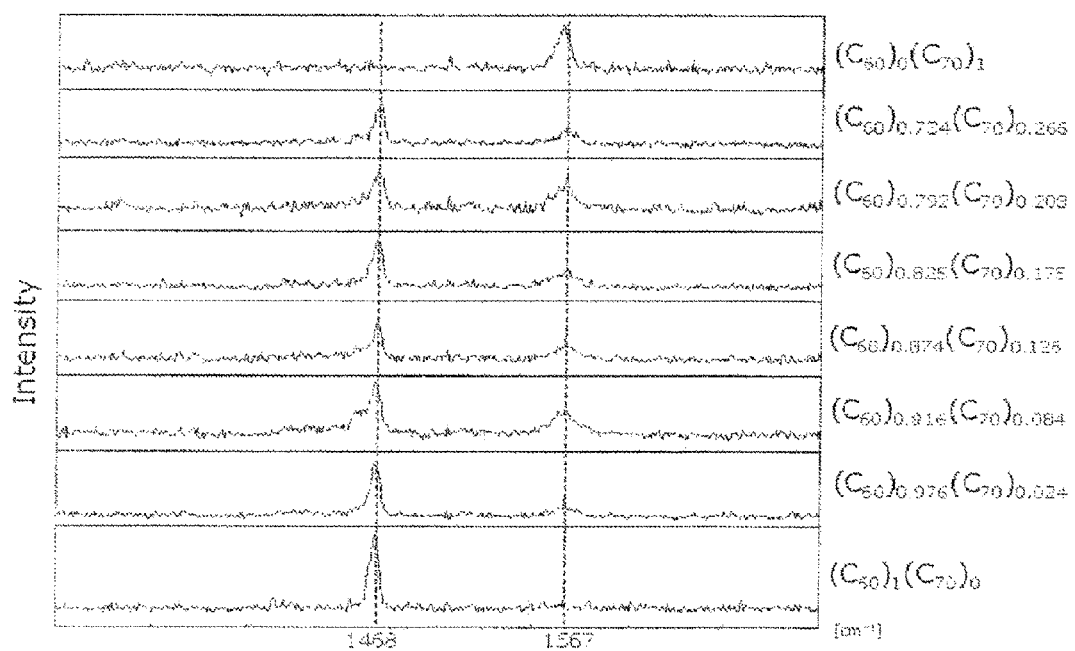
FIG. 19 shows Raman scattering spectra of $C_{60}$-$C_{70}$ mixed fine wire in each compositional ratio.

The Raman scattering spectrum of $C_{60}$-$C_{70}$ fine wire in the respective compositional ratio is as shown in FIG. 19. The $C_{60}$ peak is observed at 1468 $cm^{-1}$ and the $C_{70}$ peak at 1567 $cm^{-3}$. The former corresponds to a Ag(2) mode due to the stretching of 5-membered ring in pristine $C_{60}$, and latter to $E_2$' mode in pristine $C_{70}$, respectively. Therefore, it is found that the $C_{60}$ molecule and $C_{70}$ molecule of the $C_{60}$-$C_{70}$ mixed fine wire are not different from the pristine state, and that the $C_{60}$ molecule and $C_{70}$ molecule have no strong interaction in the $C_{60}$-$C_{70}$ mixed fine wire. From this fact, it is expected that the conjugated physicochemical property and function resulting from the physicochemical property of the monomer $C_{60}$ fine wire and $C_{70}$ fine wire can be put into practice, though it cannot be realized in the $C_{60}$ fine wire and $C_{70}$ fine wire only.

Figure 20:
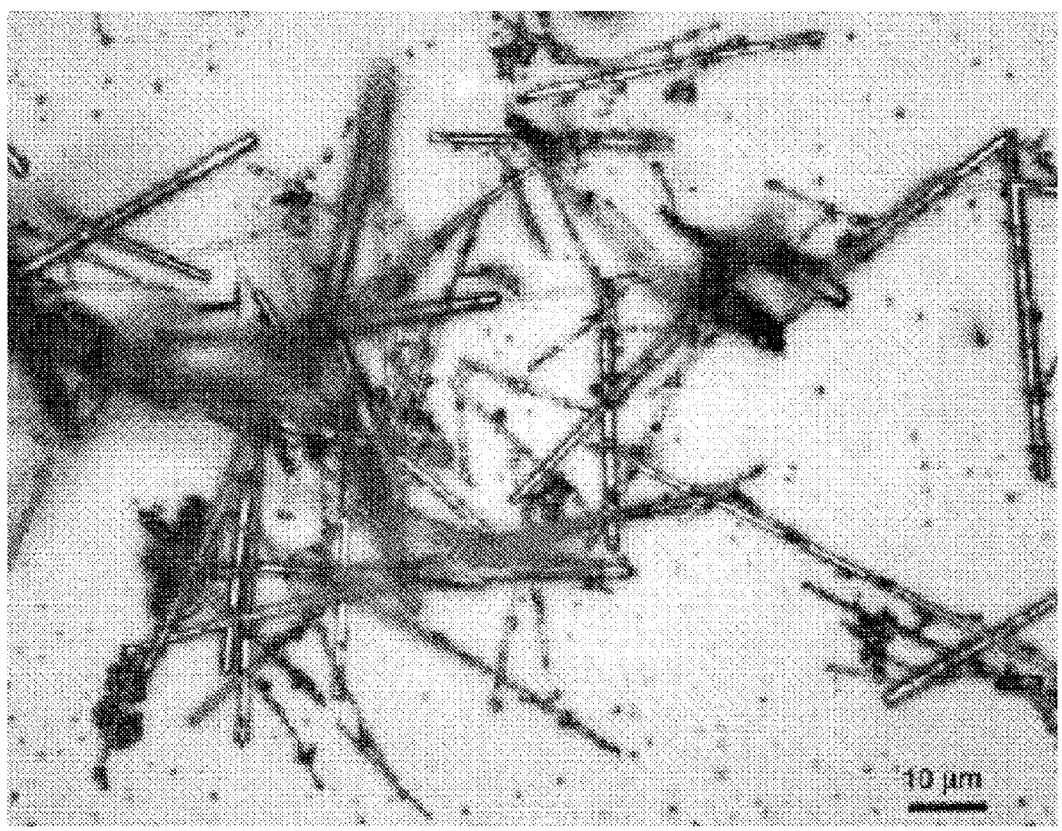
FIG. 20 shows an optical microscopic photograph showing an example of $C_{60}$-$C_{70}$ mixed fine wire.

FIG. 20 shows an example of the $C_{60}$-$C_{70}$ mixed fine wire prepared by a liquid-liquid interfacial precipitation method using $C_{60}$-$C_{70}$ mixed powder (the content of $C_{70}$: about 20 mass %) in a toluene-isopropyl alcohol medium.

The invention is, of course, not limited by the above Example 5. It need hardly be said that a variety of embodiments are possible in details such as the kinds of organic solvents or polar solvents.

INDUSTRIAL APPLICABILITY

Since the tubular wall in the fullerene shell capsules and true fullerene shell tubes prepared by the method of the invention are constituted with fullerene molecules and it can be modified inside and outside with a functional group such as hydroxyl group, malonic acid group, or sulfonic acid group, a wide variety of functions such as of catalyst, anti-microbials, active oxygen generating mediators, and so on can be given.

In addition, heretofore, there was no capsule-like fullerene characteristic in the shape in the invention. The fullerene shell capsule has a wide range of utility as catalyst supporting material, adsorbent, various gas preserving agent, light resin composite material, and the like. After use, the capsule may be decomposed to recover fullerene molecules for recycle use. By developing this technology, there is some possibility that hollow fullerene nano fiber (="true fullerene shell tube") in which the tube wall is composed of fullerene molecule only may be prepared.

Furthermore, according to the invention, the semi-conductor $C_{60}$-$C_{70}$ mixed fine wire can be changed variously in the physicochemical properties such as electrical property, mechanical property, thermal property, optical property, and the like according to the invention, and thus, it is expected to use as a semi-conductor freely variable in the property; thus, it is expected to be used as a semi-conductor of which the property is changed freely.

In addition, according to the $C_{60}$-$C_{70}$ mixed fine wire, it is possible to change the physicochemical property such as electric resistivity, mechanical property, thermal resistance, light absorption, and so on, variously by changing the composition. The physicochemical properties and function which cannot be attained in a monomer alone can be realized.

The invention claimed is:

1. A $C_{60}$ fullerene needle comprising an amorphous structure, wherein nanometer-sized particles of platinum are dispersed thereon.

2. The $C_{60}$ fullerene needle as claimed in claim 1, having a hollow structural portion.

3. A $C_{60}$ fullerene needle comprising an amorphous structure, wherein nanometer-sized particles of platinum are dispersed thereon and having an end that is closed or open.

4. A method for preparing a needle crystal comprising a $C_{60}$ platinum derivative and $C_{60}$ fullerene molecules that is single crystalline and having a hollow structural portion by a liquid-liquid interfacial precipitation method, which comprises (1) a step in which a solution containing a first solvent dissolving the $C_{60}$ platinum derivative and the $C_{60}$ fullerene molecules therein, wherein the amount of the $C_{60}$ platinum derivative to be added is in the range of 1-10 mass % for the $C_{60}$ fullerene molecules, is combined with an alcohol as a second solvent; (2) a step in which a liquid-liquid interface is formed between the solution and the second solvent; and (3) a step in which a carbon fine wire is precipitated on the liquid-liquid interface.

5. The method for preparing a needle crystal as claimed in claim 4, wherein the $C_{60}$ platinum derivative is $(\eta^2$-$C_{60})Pt(PPh_3)_2$.

6. The method for preparing a needle crystal as claimed in claim 4, wherein the first solvent is toluene.

7. The method for preparing a needle crystal as claimed in claim 4, wherein the second solvent is isopropyl alcohol.

8. A method for preparing a $C_{60}$ fullerene needle comprising an amorphous structure, wherein nanometer-sized particles of platinum are dispersed thereon, said method consisting of the following steps:
   (1) a step in which a solution containing a first solvent dissolving the $C_{60}$ platinum derivative therein is combined with an alcohol as a second solvent;
   (2) a step in which a liquid-liquid interface is formed between the solution and the second solvent;
   (3) a step in which a carbon fine wire is precipitated on the liquid-liquid interface; and
   (4) a step in which either a vacuum thermal treatment at 600° C. or higher or an irradiation of an electron beam with high energy of 100 keV or higher is carried out on the carbon fine wire.

9. The method for preparing a $C_{60}$ fullerene needle as claimed in claim 8, wherein the $C_{60}$ platinum derivative is $(\eta^2$-$C_{60})Pt(PPh_3)_2$.

10. The method for preparing a $C_{60}$ fullerene needle as claimed in claim 8, wherein the first solvent is toluene.

11. The method for preparing a $C_{60}$ fullerene needle as claimed in claim 8, wherein the second solvent is isopropyl alcohol.

* * * * *